United States Patent
Bergendahl et al.

(10) Patent No.: US 11,552,077 B2
(45) Date of Patent: Jan. 10, 2023

(54) GATE CUT WITH INTEGRATED ETCH STOP LAYER

(71) Applicant: TESSERA LLC, San Jose, CA (US)

(72) Inventors: Marc A. Bergendahl, Troy, NY (US); Andrew M. Greene, Albany, NY (US); Rajasekhar Venigalla, Hopewell Junction, NY (US)

(73) Assignee: TESSERA LLC, San Jose, CA (US)

(*) Notice: Subject to any disclaimer, the term of this patent is extended or adjusted under 35 U.S.C. 154(b) by 98 days.

(21) Appl. No.: 17/221,401

(22) Filed: Apr. 2, 2021

(65) Prior Publication Data

US 2021/0305247 A1    Sep. 30, 2021

Related U.S. Application Data

(63) Continuation of application No. 16/738,569, filed on Jan. 9, 2020, now Pat. No. 10,998,314, which is a
(Continued)

(51) Int. Cl.
*H01L 27/088* (2006.01)
*H01L 21/8234* (2006.01)
(Continued)

(52) U.S. Cl.
CPC .... *H01L 27/0886* (2013.01); *H01L 21/02181* (2013.01); *H01L 21/31144* (2013.01); *H01L 21/32133* (2013.01); *H01L 21/76802* (2013.01); *H01L 21/76877* (2013.01); *H01L 21/823431* (2013.01); *H01L 21/823437* (2013.01); *H01L 21/823468* (2013.01);
(Continued)

(58) Field of Classification Search
CPC ............ H01L 27/0886; H01L 27/0924; H01L 21/02181; H01L 21/31144; H01L 21/76877; H01L 21/823431; H01L 21/823468; H01L 21/823475; H01L 21/823821; H01L 23/5286; H01L 23/5329; H01L 23/62; H01L 29/66545; H01L 29/66795; H01L 29/785
See application file for complete search history.

(56) References Cited

U.S. PATENT DOCUMENTS 7,723,189 B2    5/2010    Eun et al.
8,569,152 B1    10/2013    Basker et al.
(Continued)

OTHER PUBLICATIONS

Cai, M. et al., "Micro-Plasma Field-Effect Transistors," IEEE Sensors Proc., 2012, pp. 17-20.

*Primary Examiner* — Marc Anthony Armand
(74) *Attorney, Agent, or Firm* — Haley Guiliano LLP (57) ABSTRACT

A method of forming a power rail to semiconductor devices comprising removing a portion of the gate structure forming a gate cut trench separating a first active region of fin structures from a second active region of fin structures. A conformal etch stop layer is formed in the gate cut trench. A fill material is formed on the conformal etch stop layer filling at least a portion of the gate cut trench. The fill material has a composition that is etched selectively to the conformal etch stop layer. A power rail is formed in the gate cut trench. The conformal etch stop layer obstructs lateral etching during forming the power rail to substantially eliminate power rail to gate structure shorting.

25 Claims, 9 Drawing Sheets

Related U.S. Application Data continuation of application No. 16/054,394, filed on Aug. 3, 2018, now Pat. No. 10,580,773, which is a continuation of application No. 15/258,513, filed on Sep. 7, 2016, now Pat. No. 10,083,961.

(51) Int. Cl.

| | |
|---|---|
| *H01L 29/66* | (2006.01) |
| *H01L 21/3213* | (2006.01) |
| *H01L 21/311* | (2006.01) |
| *H01L 21/768* | (2006.01) |
| *H01L 23/528* | (2006.01) |
| *H01L 23/532* | (2006.01) |
| *H01L 23/62* | (2006.01) |
| *H01L 21/02* | (2006.01) |
| *H01L 21/8238* | (2006.01) |
| *H01L 27/092* | (2006.01) |
| *H01L 29/78* | (2006.01) |

(52) U.S. Cl.
CPC ........... *H01L 21/823475* (2013.01); *H01L 21/823821* (2013.01); *H01L 23/5286* (2013.01); *H01L 23/5329* (2013.01); *H01L 23/62* (2013.01); *H01L 27/0924* (2013.01); *H01L 29/66545* (2013.01); *H01L 29/66795* (2013.01); *H01L 29/785* (2013.01)

(56) References Cited

U.S. PATENT DOCUMENTS

| | | |
|---|---|---|
| 8,617,996 B1 | 12/2013 | Chi et al. |
| 8,637,359 B2 | 1/2014 | Chang et al. |
| 8,735,235 B2 | 5/2014 | Chuang et al. |
| 8,946,793 B2 | 2/2015 | Xie et al. |
| 9,064,932 B1 | 6/2015 | Pham et al. |
| 9,070,585 B2 | 6/2015 | Hossain et al. |
| 9,184,101 B2 | 11/2015 | Lo et al. |
| 9,209,178 B2 | 12/2015 | Kanakasabapathy et al. |
| 9,269,628 B1 | 2/2016 | Jacob |
| 9,508,727 B2 | 11/2016 | Park et al. |
| 9,524,908 B2 | 12/2016 | Qi et al. |
| 9,704,973 B2 | 7/2017 | Xie et al. |
| 9,805,983 B1 | 10/2017 | Cheng et al. |
| 9,831,306 B2 | 11/2017 | Webb et al. |
| 10,043,806 B2 | 8/2018 | Kim et al. |
| 10,083,961 B2 | 9/2018 | Bergendahl et al. |
| 10,381,458 B2 | 8/2019 | Greene et al. |
| 10,593,801 B2 | 3/2020 | Lee et al. |
| 2007/0259499 A1* | 11/2007 | Eun ............... H01L 29/66583 257/E21.546 |
| 2013/0221436 A1* | 8/2013 | Hossain ............ H01L 29/1095 257/334 |

\* cited by examiner

GATE CUT WITH INTEGRATED ETCH STOP LAYER

CROSS-REFERENCE TO RELATED APPLICATIONS

This application is a continuation of and claims priority to U.S. patent application Ser. No. 16/738,569, filed on Jan. 9, 2020, which is a continuation of U.S. patent application Ser. No. 16/054,394, filed on Aug. 3, 2018, now U.S. Pat. No. 10,580,773, issued Mar. 3, 2020, which is a continuation of U.S. patent application Ser. No. 15/258,513, filed on Sep. 7, 2016, now U.S. Pat. No. 10,083,961, issued Sep. 25, 2018, each of which is incorporated by reference herein in its entirety for all purposes.

BACKGROUND

Technical Field

The methods and structures described herein relate to contact structures and gate structures used in semiconductor devices, and methods for forming contact structures and gate structures in semiconductor devices using subtractive etching.

Description of the Related Art

Modern integrated circuits are made up of literally millions of active devices such as transistors. Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Continuing trends in semiconductor device manufacturing include a reduction in electrical device feature size (scaling). With increasing scaling, new processing sequences and methods may be required to avoid shorting of adjacent electrical devices.

SUMMARY

In one embodiment, a method of cutting gate structures in a gate cut last process flow for forming semiconductor devices is provided that employs an integrated etch stop layer. In one embodiment, the method may begin with providing a first active semiconductor region and a second active semiconductor region; and forming a gate structure extending from the first active region to the second active region. In a following process step, a gate cut removes a portion of the gate structure forming a gate cut trench separating the first active region from the second active region. A conformal etch stop layer is formed in the gate cut trench, wherein a nitride containing fill for the gate cut trench is formed on the conformal etch stop layer. A source power rail interconnect is formed in the gate cut trench, wherein the conformal etch stop layer obstructs lateral etching during forming the source power rail interconnect to substantially eliminate power rail to gate structure shorting.

In another embodiment, a method of cutting gate structures in a gate cut last process flow for forming semiconductor devices is provided that employs an integrated etch stop layer. In one embodiment, the method may begin with providing a first active semiconductor region and a second active semiconductor region; and forming a sacrificial gate structure extending from the first active region to the second active region. In a following process step, a gate cut removes a portion of the sacrificial gate structure forming a gate cut trench separating the first active region from the second active region. A conformal etch stop layer is formed in the gate cut trench, wherein a nitride containing fill for the gate cut trench is formed on the conformal etch stop layer. The sacrificial gate structure is replaced with a functional gate structure. A source power rail interconnect is formed in the gate cut trench, wherein the conformal etch stop layer obstructs lateral etching during forming the power rail to substantially eliminate opening of the interlevel dielectric to the sacrificial gate structure.

In another aspect, an electrical device is provided, in which a power rail is positioned in a gate cut trench positioned between the tip to tip distance separating adjacent gate structures, wherein the gate cut trench is lined with an etch stop layer. In one embodiment, the electrical device includes a first active region having a first gate structure; and a second active region having a second gate structure, wherein the first and second gate structures are aligned to one another and separated by a gate cut trench. A conformal dielectric layer is present on at least sidewall surfaces of the gate cut trench. A dielectric fill in present filling a lower portion of the gate cut trench. A power rail is present in an upper portion of the gate cut trench.

BRIEF DESCRIPTION OF DRAWINGS

The following description will provide details for some of the preferred embodiments with reference to the following figures wherein.

DETAILED DESCRIPTION OF PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present description. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. As used herein a "field effect transistor" is a transistor in which output current, i.e., source-drain current, is controlled by the voltage applied to the gate. A field effect transistor has three terminals, i.e., gate structure, source region and drain region. A "gate structure" means a structure used to control output current (i.e., flow of carriers in the channel) of a semiconducting device through electrical or magnetic fields. As used herein, the term "channel" is the region underlying the gate structure and between the source and drain of a semiconductor device that becomes conductive when the semiconductor device is turned on. As used herein, the term "source" is a doped region in the semiconductor device, in which majority carriers are flowing into the channel. As used herein, the term "drain" means a doped region in semiconductor device located at the end of the channel, in which carriers are flowing out of the transistor through the drain.

The etch steps for forming the electrical contacts to the gate structures of semiconductor devices, such as field effect semiconductor devices (FETs), e.g., metal oxide semiconductor field effect transistors (MOSFETs), and the etch steps for forming power rails for the semiconductor devices can be an issue leading to device failure in semiconductor devices formed using dummy gate cut last, i.e., CT last, process flow. The term "power rail" denotes an electrical current carrying structure that powers the electrical device, i.e., provides voltage to the semiconductor device. The power rail may be in electrical communication with at least one of the source region or the drain region of the semiconductor device.

In dummy gate cut last (CT last) process flow, the etch process for cutting the dummy gate structure, i.e., sacrificial gate structure, is after the formation of the source and drain epitaxial material; after the formation of an interlevel dielectric over the source and drain regions; and after a planarization process that is applied to the interlevel dielectric so that the upper surface of the interlevel dielectric is coplanar with the upper surface of the dummy gate structure. It has been determined that in some process flows, the nitride liners, e.g., silicon nitride liners, that are present in the gate cut trench can be etched by the process sequence for forming the power rail, which can cause shorting between the power rail and the gate structures due to lateral etching that typically occurs while forming the openings for the power rail in the gate cut trench. A short CB opening, i.e., a gate contact opening having a short height, should land on the top of the active gate. The long CB power rail, i.e., the source interconnection with runs through the cut gate (metal), sits within the gate cut trench for the dummy gate, i.e., CT region (trench separating portions of the gate structures on separate active regions), and can cause shorting between the power rail, and the replacement metal gate structure. The replacement metal gate structure, i.e., PC, is typically a dummy gate structure (also referred to as a sacrificial gate structure), such as one composed of silicon, i.e., dummy silicon, that eventually is replaced with an active gate during the replacement metal gate module. In other examples, the etch process for forming the electrical contact to the gate, i.e., CB contact, includes an over-etch into the substrate, which can lead to leakage between the substrate and the power rail contact.

In some embodiments, the methods and structures disclosed herein prevent etching of the electrical contact (CB) power rail opening from etching into the underlying substrate. In some embodiments, the methods and structures disclosed herein prevent electrical contact (CB) power rail and critical dimension (CD) blow-up during reactive ion etching (ME) of silicon nitride liners that are present in the dummy gate trench, i.e., (CT) trench. In some embodiments, the methods and structures disclosed herein provide an etch stop layer within the dummy gate trench, i.e., (CT) trench, in which the etch stop layer helps to avoid etching of the electrical contact (CB) opening into the substrate, and the etch stop layer helps to prevent electrical contact (CB) and critical dimension (CD) blow-up. The methods and structures disclosed herein may use a PC "cut last" method to define active gate regions post spacer/EPI module. This process can be demonstrated in Poly Open chemical mechanical planarization (CMP) (POC) or replacement metal gate (RMG) modules. This process improves PC or gate "tip-to-tip" dimension or the gate cut width (distance between cut gate lines) (PC T2T) window for scaling.

In some embodiments, the methods disclosed herein can prevent two issues in the middle of the line (MOL) module. In some examples, the methods and structures disclosed herein can prevent CB CD blow-up, i.e., an increased in the power rail contact (CB) critical dimension (CD), during CB RIE, i.e., reactive ion etch for forming the electrical contact to the gate structure (CB). The CB power rail, i.e., source/drain contact that runs through the cut gate (metal), which runs along the CT region, i.e., gate trench opening, that is filled with SiN can be laterally etched during processing for forming the CB gate contact to the gate metal. The selective SiN etch integrated into the CB contact RIE process is intended to etch through the SiN self-aligned contact cap (SAC Cap). This part of the etch process exposes the active gate metal for contact formation, but also laterally blows-up the CB power rail contact CD within the CT trench region due to the SiN CT liner fill. In some other examples, the methods and structures disclosed herein can prevent power rail over-etch during CB RIE, i.e., the reactive ion etch process for forming the gate contact (CB) to the gate metal and for forming the power rail interconnect contact to the source regions of devices from over-etching into the substrate, which can lead to parasitic leakage and potentially substrate shorting.

In some embodiments, the methods and structures provide a number of advantages in the Replacement Metal Gate (RMG) and Poly Open Chemical mechanical planarization (CMP) (POC) process modules. For example, the gate cut-last methods and structures may prevent source to drain epitaxial shorting around a cut end of dummy gate structure (PC), i.e., the end line of the dummy gate structure (PC). In one example, the methods and structures may preserve sidewall spacers by eliminating the requirement to cut the dummy gates prior to source/drain EPI formation. Dummy gate cut prior to spacer deposition results in an exposed corner edge which is more vulnerable to pull-down and exposure of a-Si during spacer RIE etch-back. Gate cut-last after the spacer and EPI formation reduces the threat of exposing the amorphous silicon ($\alpha$-Si) of the dummy gate structure, and avoids subsequent parasitic epitaxial nodule growth. This parasitic nodule growth can result in incomplete poly open contact (POC) poly pull middle of the line (MOL) contact opens, and local variations in uniformity that degrades the replacement metal gate (RMG) module. In further examples, the methods and structures disclosed herein provide for improved gate tip-to-tip scaling in static random access memory (SRAM) logic circuits. In some other examples, the methods and structures disclosed herein minimize the incidence of source/drain to gate contact shorting in devices using a shared local interconnect. The method and structures for employing gate cuts with integrated etch stop layers, are now described in more detail with reference to FIGS. 1-15.

Figure 1:
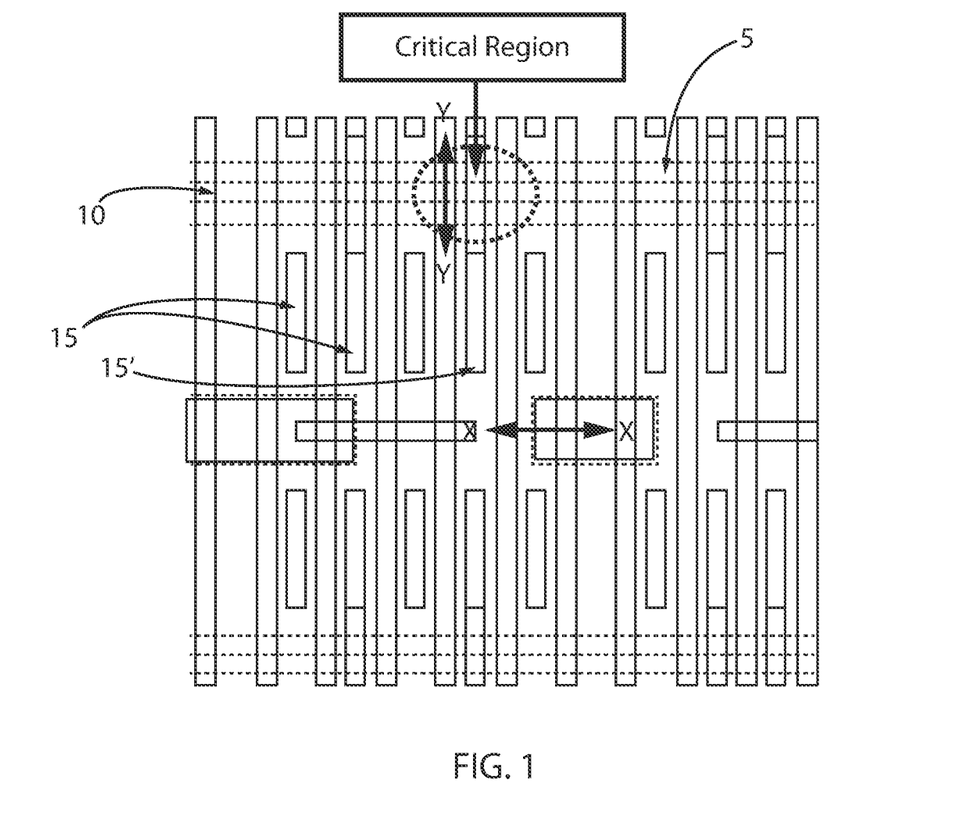
FIG. 1 is a top down planar view depicting one embodiment of a gate contact opening, i.e., CT region, for a semiconductor device that is filled and pinched off with a dielectric layer.

FIG. 1 is a top down view depicting one embodiment of a gate cut trench 5, i.e., CT region, that is filled and pinched off with a dielectric layer, e.g., silicon nitride layer (SiN). The CB power rail, i.e., the local interconnect signal line which connects transistor source contact regions that runs through the cut gates on STI (shallow trench isolation), is identified in FIG. 1 by reference number 10. Source/drain regions are identified by reference number 15. The source contact regions that are connected to the CB power rail are identified by reference number 15'. The intersection of the source regions 15', the CB power rail 10 and the CT region 5 is a critical region, as labeled in FIG. 1.

Figure 2:
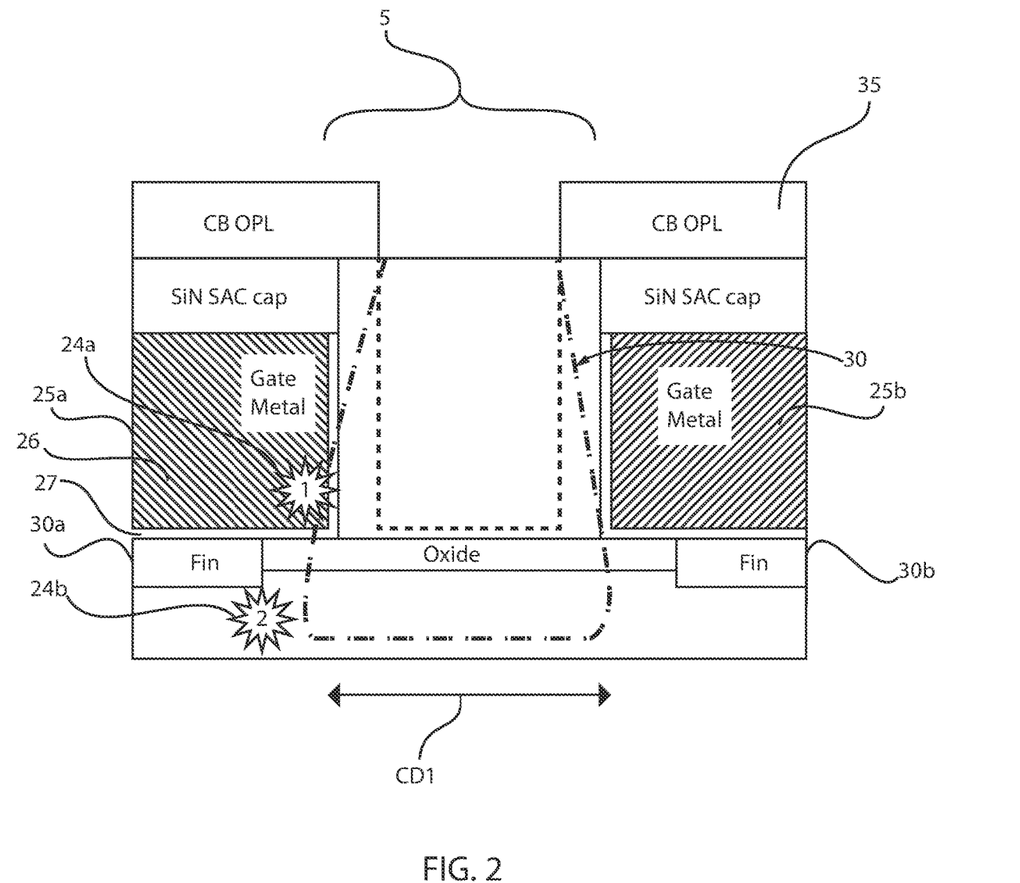
FIG. 2 is a side cross-sectional view depicting one embodiment of the gate tip to tip critical dimension (CD) for the critical region that is depicted in FIG. 1.

FIG. 2 is a side cross sectional view of the critical region (Y-Y) depicted in FIG. 1. The gate tip to tip critical dimension (CD) is identified by CD1. The gate cut trench 5 is present within the critical dimension (CD) and is typically filled with a nitride fill material 30, such as silicon nitride. The nitride fill material 30 within the gate cut trench 5 separates a first gate structure 25a that is present over a first active region 30a from a second gate structure 25b that is present over a second active region 30b. It has been determined that the etch step (which includes forming the etch mask identified by reference number 35 using lithography and pattern transfer) includes an etch chemistry that is selected to etch the nitride of the SAC Cap (not labeled) on active gates and to land a contact on the gate metal, but the etch process can cause lateral blow-up, i.e., lateral etching to the sidewalls of the gate structures 25a, 25b, within the SiN filled CT trench which can short the power rail to the adjacent active gate structures (identified by reference number 24a). This can be worse with lithography containing poor overlay, i.e., misalignment of the etch mask 35. Additionally, the over etching can cause a short to the substrate (identified by reference number 24b).

Figure 3A:
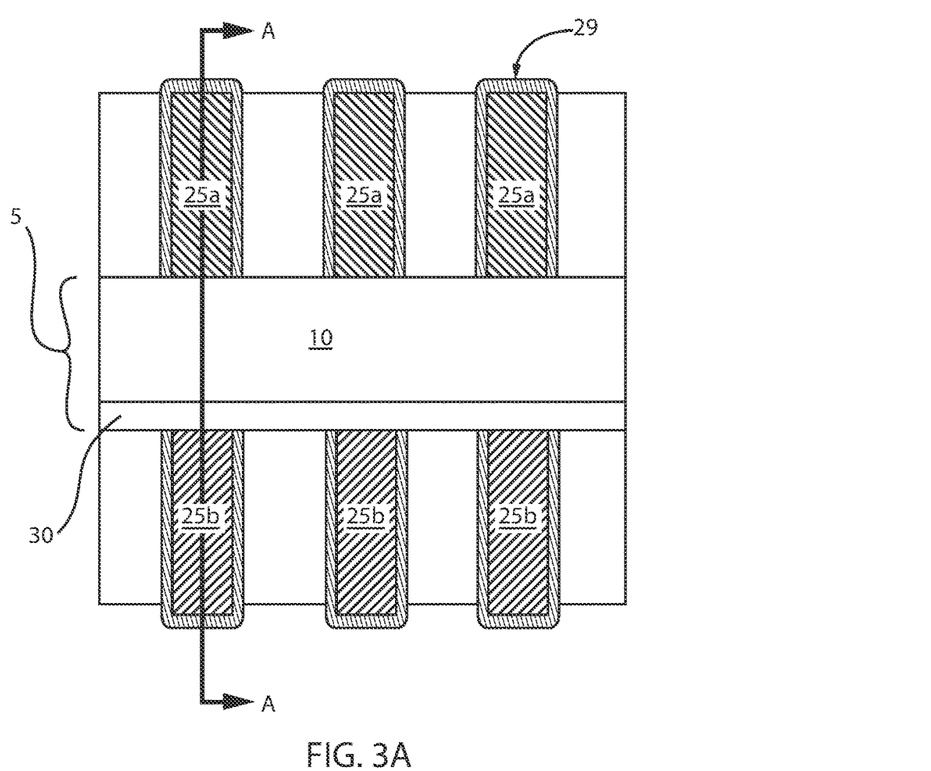
FIG. 3A is a top down planar view depicting one embodiment of a misaligned power rail being formed in a gate cut trench.
Figure 3B:
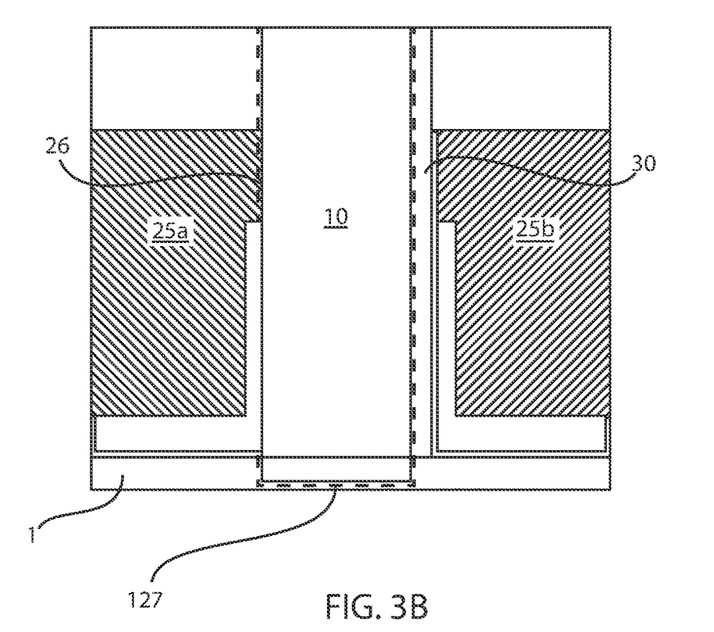
FIG. 3B is a side cross-sectional view along section line Y-Y (cross-section across the gate cut trench including the power rail) of FIG. 3A.

FIGS. 3A and 3B illustrate one example of a misaligned power rail 10 being formed in a gate cut trench 5. FIGS. 3A and 3B illustrate a gate cut trench 5 that is only filled with a nitride fill material 30, such as silicon nitride. FIGS. 3A and 3B illustrate that the misaligned power rail 10 shorting to the first gate structures 25a overlying the first active region due to the misalignment of the power rail 10, and/or over etching in a lateral direction towards the first gate structures 25a. More specifically, the metal, e.g., contact metal liner and tungsten (W), of the power rail 10 directly contacts the gate metal, e.g., tungsten (W) and Work Function Metal (WFM). This is illustrated by the interface identified by reference number 26. FIGS. 3A and 3B further illustrate that over etching in the vertical direction can result in the metal, e.g., tungsten (W), of the power rail 10 contacting a semiconductor substrate 1, which may also short the device. This is illustrated by the interface identified by reference number 127.

Figure 4A:
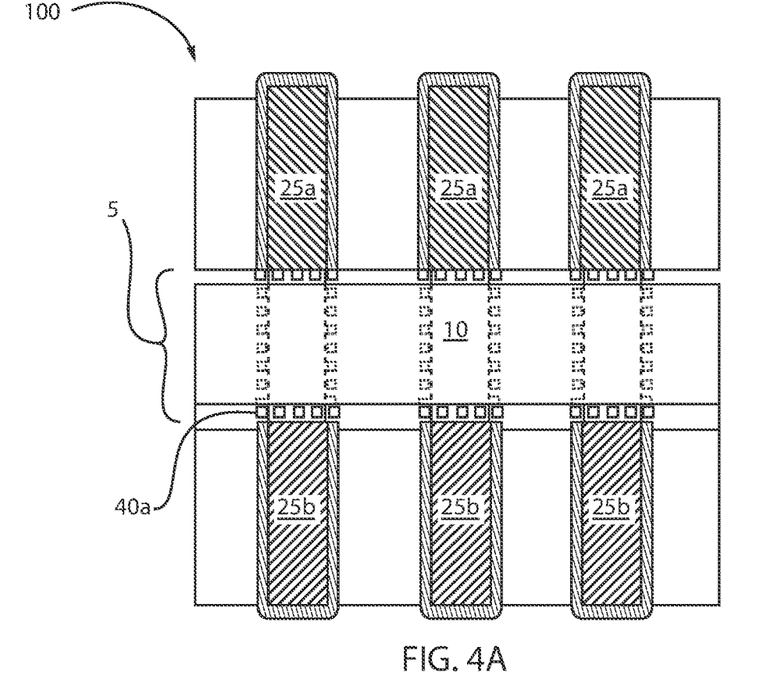
FIG. 4A is a top down planar view depicting one embodiment of a misaligned power rail being formed in a gate cut trench, in which shorting to the substrate and the gate structures is obstructed by an etch stop layer that is positioned in the gate cut trench.
Figure 4B:
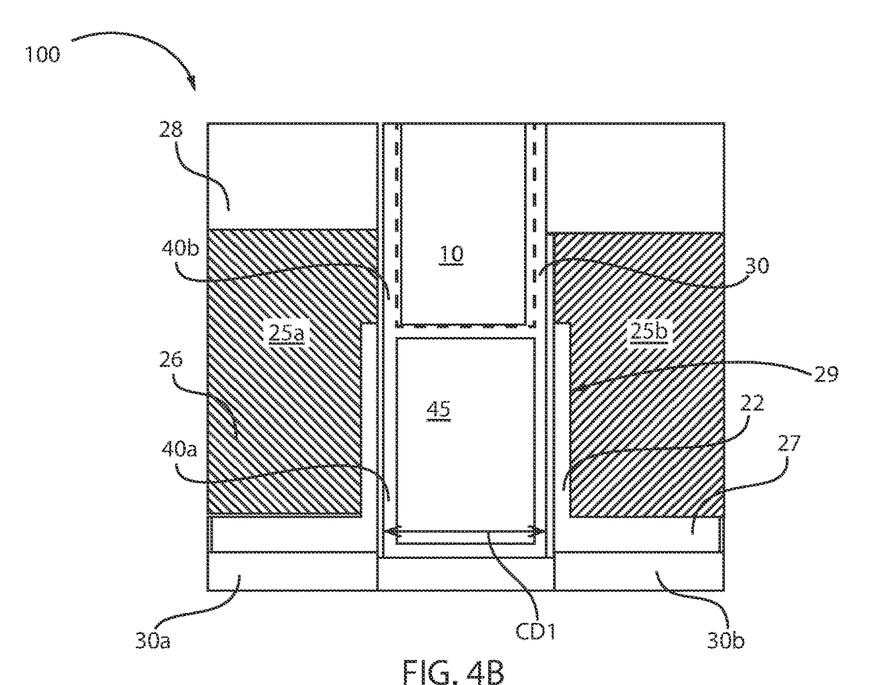
FIG. 4B is a side cross-sectional view along section line Y-Y (cross-section across the gate cut trench including the power rail) of FIG. 4A, in which the gate cut trench includes two conformal etch stop layers.
Figure 4C:
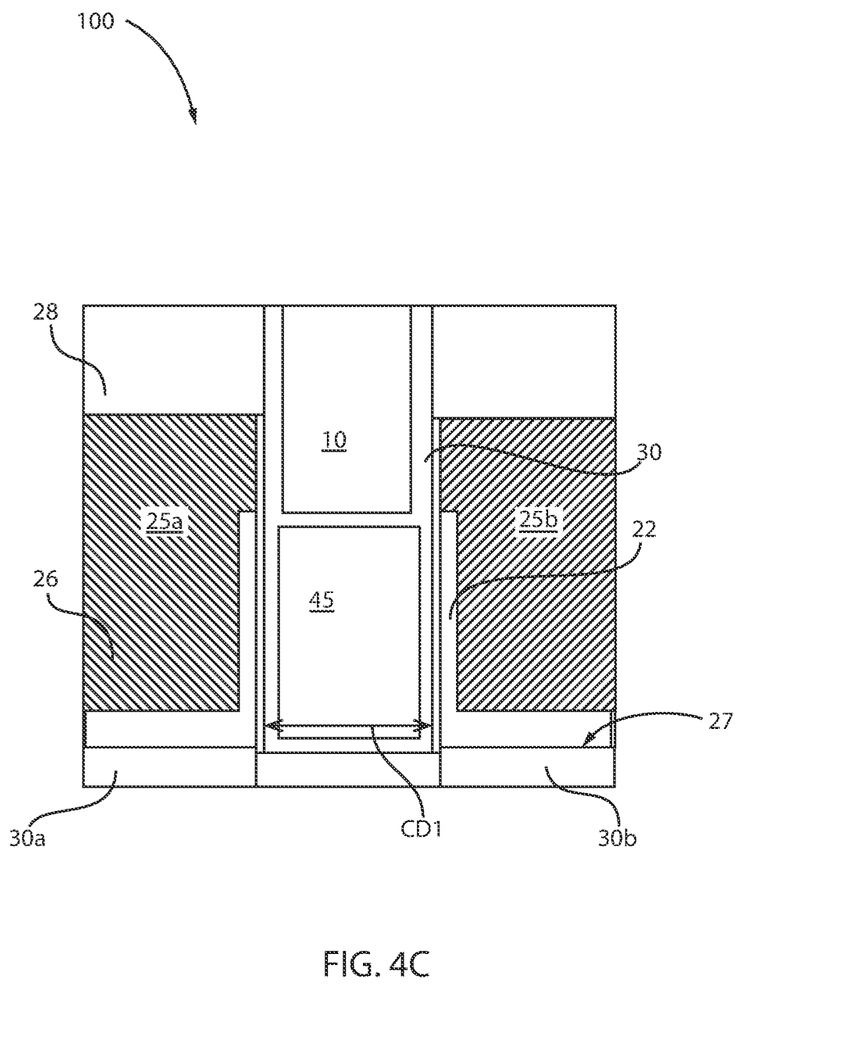
FIG. 4C is a side cross-sectional view along section line Y-Y (cross-section across the gate cut trench including the power rail) of FIG. 4A, in which the gate cut trench includes a single conformal etch stop layer.

FIGS. 4A-4C depict a misaligned power rail 10 being formed in a gate cut trench 5, in which shorting to the substrate and the gate structures 25a, 25b is obstructed by an etch stop layer 40a, 40b that is positioned in the gate cut trench 5. FIGS. 4A-4C illustrate one embodiment of an electrical device that includes a first active region 30a having a first gate structure 25a; and a second active region 30b having a second gate structure 25b. The first and second active regions 30a, 30b are the portions of the electrical device including at least a channel portion of a semiconductor device, such as a field effect transistor (FET). In some embodiments, the first and second active regions 30a, 30b may include at least one fin structure, e.g., when the FETs being formed are fin-type field effect transistors (FETs). As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. The portions of the fin structure adjacent on the opposing sides of the channel portion are the source and drain region portions of the fin structure. The source and drain regions of the semiconductor devices may be doped to an n-type or p-type conductivity. The fin structures may be composed of a type IV semiconductor, such as silicon (Si), germanium (Ge) or a combination thereof, e.g., silicon germanium (SiGe), or the fin structures may be composed of a type III-V semiconductor, such as gallium arsenic (GaAs).

Referring to FIGS. 4A-4C, the first and second gate structures 25a, 25b are aligned to one another and separated by a gate cut trench 5. By aligned it is meant that the centerline of the first gate structure 25a (that is perpendicular to the channel length) is aligned to the centerline of the second gate structure 25b. As will be further described below, a gate cut etch is applied to the portion of an sacrificial gate structure separating the portion of the sacrificial gate structure, i.e., first portion, that is present on the first active region 30a from the portion of the sacrificial gate structure, i.e., second portion, that is present on the second active region 30b. The first portion of the sacrificial gate structure provides the first gate structure 25a, and the second portion of the sacrificial gate structure provides the second gate structure 25b.

Each of the first and second gate structures 25a, 25b may include at least one gate dielectric 27 and at least one gate conductor 26. In one embodiment, the gate dielectric 27 may be composed of silicon oxide, or a high-k dielectric material, such as hafnium oxide (HfO$_2$). The gate conductor 26 may be composed of a conductive material, such as a metal, such as tungsten (W), or a doped semiconductor, e.g., n-type doped polysilicon. In some embodiments, the first and second gate structures 25a, 25b may further include an n-type or p-type work function metal (WFM) 22, e.g., titanium nitride. As will be described in further detail below the gate structures 25a, 25b may be formed using gate last, i.e., replacement gate processing, e.g., replacement metal gate (RMG) processing. In some embodiments, each of the first and second gate structures 25a, 25b may include a dielectric gate cap 28. The dielectric gate cap 28 may include a nitride material, such as silicon nitride.

Still referring to FIGS. 4A-4C, gate sidewall spacers 29 may be present on the sidewalls of the gate structure 25a, 25b. The gate sidewall spacers 29 may be composed of a dielectric material, such as an oxide, nitride or oxynitride material. In some embodiments, the gate sidewall spacers 29 may be composed of silicon nitride. The gate sidewall spacers 29 may be formed using a deposition process, such as chemical vapor deposition (CVD), followed by an etch back process. This process is completed after replacement gate formation and during the source/drain epitaxy modules.

The first gate structure 25a is separated from the second gate structure 25b by a gate cut trench 5, which can dictate the tip to tip (T2T) dimension that is separating the gate structures, which can be a critical dimension CD1. In some embodiments, the critical dimension CD1 may range from 20 nm to >100 nm. This range is suitable for static random access memory (SRAM) devices to large field effect transistor (FET) macros. In some other embodiments, the critical dimension CD1 may range from 18 nm to 25 nm. This range is suitable for static random access (SRAM) devices for more aggressively scaled devices. The gate cut trench 5 may be at least partially filled with a dielectric material, such as silicon nitride. As will be further described below, the CB power rail 10 for the electrical device may be positioned within the gate cut trench 5.

FIGS. 4A-4C illustrate a conformal dielectric layer 40a, 40b (also referred to as conformal etch stop layer 40a, 40b) on at least sidewall surfaces of the gate cut trench 5. The term "conformal" denotes a layer having a thickness that does not deviate from greater than or less than 30% of an average value for the thickness of the layer. The composition for the conformal dielectric layer 40a, 40b is selected to provide that the etch process steps for forming the opening in the gate cut trench 5 does not increase the width or depth of the gate cut trench 5 in a manner that would expose a portion of the gate structures 25a, 25b or expose the underlying substrate 1. In some embodiments, the conformal etch stop layer 40a, 40b may be composed of hafnium oxide (HfO$_2$). In other embodiments, the conformal etch stop layer 40a, 40b may be composed of cerium oxide (CeO$_2$), lanthanum oxide (La$_2$O$_3$), yttrium oxide (Y$_2$O$_3$), gadolinium oxide (Gd$_2$O$_3$), europium oxide (Eu$_2$O$_3$), terbium oxide (Tb$_2$O$_3$) or combinations thereof. It is noted that the above compositions are provided for illustrative purposes only, and are not intended to limit the methods and structures described herein. For example, the conformal etch stop layer 40a, 40b may also be composed of other rare earth containing metal oxides. In some embodiments, the rare earth metal of the conformal etch stop layer 40a, 40b is selected from the group consisting of Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Luthium (Lu), and a combination thereof. Exemplary are earth oxides may include cerium oxide (CeO$_2$), lanthanum oxide (La$_2$O$_3$), yttrium oxide (Y$_2$O$_3$), gadolinium oxide (Gd$_2$O$_3$), europium oxide (Eu$_2$O$_3$), and terbium oxide (Tb$_2$O$_3$)). It is noted that in some embodiments any composition may be employed so long as it is selective to silicon nitride.

In some embodiments, the conformal dielectric layer 40a, 40b functions as an etch stop layer, in which the conformal dielectric layer 40a, 40b obstructs the power rail from shorting to the first and second gate structure. In some embodiments, the conformal dielectric layer 40a, 40b may have a thickness that ranges from 1 nm to 100 nm. In other embodiments, the conformal dielectric layer 40a, 40b may have a thickness ranging from 2 nm to 75 nm. In yet other embodiments, the conformal dielectric layer 40a, 40b may have a thickness ranging from 5 nm to 25 nm. It is noted that the above examples are provided for illustrative purposes only, and are not intended to limit the methods and structures described herein.

Referring to FIGS. 4A and 4C, in some embodiments a first conformal dielectric layer 40a is present on the base of the gate cut trench 5 atop the substrate 1, and at least the sidewalls of the gate cut trench 5 in a lower portion of the gate cut trench 5. In other embodiments, the first conformal layer 40a may extend along a height of the entirety of the sidewall of the gate cut trench 5. Referring to FIGS. 4A and 4B, in other embodiments, the conformal dielectric layer 40a, 40b may include multiple layers. For example, a first conformal dielectric layer 40a may be present on the base of the gate cut trench 5 and on the sidewalls of the gate cut trench 5, in which a gate cut trench fill material 45 is present on the first conformal dielectric layer 40a. In this embodiment, a second conformal dielectric layer 40b may be present in the upper portion of the gate cut trench 5, in which the second conformal dielectric layer 40b is present on the gate cut trench fill material 45 and is present on the sidewalls of the upper portion of the gate cut trench 5. The second conformal dielectric layer 40b can obstruct the etch process steps for forming the opening, i.e., CB opening, for the CB power rail from etching too deeply into the gate cut trench 5, i.e., obstructs the etch process steps for forming the CB opening from contacting the substrate. For example, the second conformal dielectric layer 40b can protect the gate cut trench fill material 45 from being etched. It is noted that the first conformal dielectric layer 40a, and the second conformal dielectric layer 40b may be composed of the same composition material, or that the first conformal dielectric layer 40a and the second conformal dielectric layer 40b may have a different composition material. Referring to FIGS. 4A-4C, a power rail 10 is present in an upper portion of the gate cut trench 5. The power rail 10 may be composed of an electrically conductive material. For example, the power rail 10 may be composed of tungsten (W). In other embodiments, the power rail 10 may be composed of a metal that is selected from cobalt (Co), ruthenium (Ru), titanium (Ti), aluminum (Al), copper (Cu) and combinations thereof. As depicted in FIGS. 4A and 4B, the power rail 10 may be in direct contact with the conformal dielectric layer, e.g., second conformal dielectric layer 40b. The conformal dielectric layer 40a, 40b may separate the power rail 10 from the gate conductors 26 of the first and second gate structures 25a, 25b; therefore obstructing the power rail 10 from shorting to the first and second gate structures 25a, 25b.

The structures depicted in FIGS. 4A-4C illustrate some embodiments of the structures provided herein. Some embodiments of methods for forming structures, as depicted in FIGS. 4A-4C, as well as similar power rail including structures, are now described in greater detail with reference to FIGS. 5-15. FIGS. 5-15 represent the process flow of the gate cut last method with depositing conformal etch stop layers in the gate cut trench region. These figures describe the process flow to form an active and cut gate along the X-X cross-section direction from FIG. 1 and do not contain the CB power rail as shown in FIG. 1 Y-Y, FIG. 2, FIG. 3A-3B or FIG. 4A-4C.

Figures 5, 8:
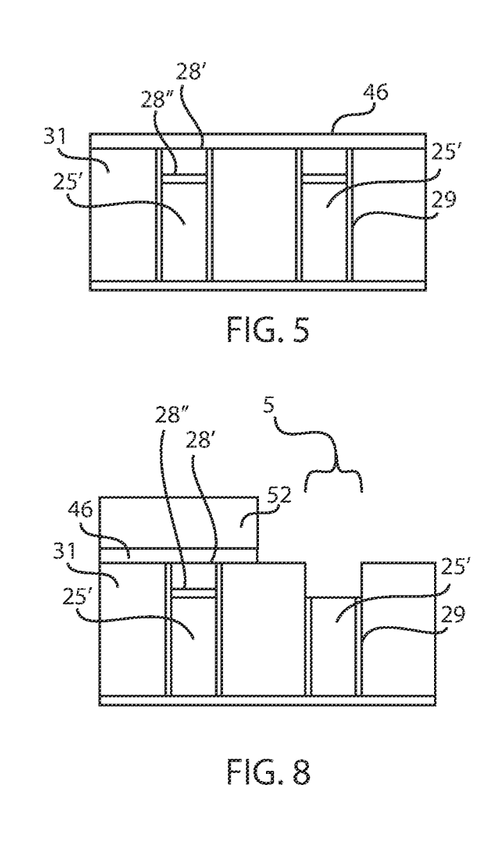
FIG. 5 is a side cross-sectional view (similar to the cross-section along section line X-X of FIG. 1) depicting one embodiment of a plurality of gate structures, in which one of the gate structures is etched to provide a gate cut trench.
FIG. 8 is a side cross-sectional view (similar to the cross-section along section line X-X of FIG. 1) depicting one embodiment of etching the SiN hard mask and sacrificial liner of the sacrificial gate structure depicted in FIG. 7.

The process flow depicted in FIGS. 5-11 illustrates one embodiment of forming a structure including the power rail depicted in FIGS. 4A and 4C. FIG. 5 depicts a plurality of sacrificial gate structures 25', in which one of the gate structures 25' is etched to provide a representation gate cut trench 5. The sacrificial gate structures 25' are formed atop active regions of the electrical device, at which a channel region of a semiconductor device is present. As described above, the active regions may include fin structures, in which the semiconductor devices being formed are fin type field effect transistors (FinFETs). The sacrificial gate structures 25' are composed of a material that may be removed selectively to the underlying active region, in which the geometry of the sacrificial gate structures 25' dictates the later formed functional gate structures, in which the sacrificial gate structures 25' may be replaced using a replacement metal gate (RMG) process flow. In some embodiments, the sacrificial gate structures 25' may be composed of a semiconductor material, such as silicon (Si), e.g., amorphous silicon or polysilicon. In some embodiments, a sacrificial gate cap or hard mask 28', 28" may be present atop the sacrificial gate conductor. In some embodiments, the sacrificial gate hard mask may include an oxide layer 28", e.g., silicon oxide (SiO$_2$) layer, present atop the gate conductor portion of the sacrificial gate structure 25', in which a nitride layer 28', e.g., silicon nitride hard mask layer, is present on the oxide layer 28". In some embodiments, an alternative gate hard mask material can be used which offers the required etch selectivity for processing.

Following the formation of the sacrificial gate structures 25, source and drain regions may be formed in each of the active regions. In some embodiments, a sidewall spacer dielectric film 29 is deposited over all structures and etched back to expose the source/drain epitaxy surface. The source and drain regions may be formed by ion implantation or by forming an in-situ doped epitaxial semiconductor material. For example, when the active regions include fin structures, the source and drain regions may be formed by epitaxially forming in situ doped semiconductor material on the portions of the fin structures that are on opposing sides of the channel region of the fin structures.

Following formation of the source and drain regions, an interlevel dielectric layer 31 is formed between and over the sacrificial gate structures 25', the active regions, and the source and drain regions. The interlevel dielectric layer 31 may be formed using a deposition method, such as chemical vapor deposition (CVD), e.g., plasma enhanced chemical vapor deposition (PECVD), deposition from chemical solution, or spin on deposition. Following deposition, the interlevel dielectric layer 31 is planarized, e.g., planarized by chemical mechanical planarization (CMP), so that the upper surface of the interlevel dielectric layer 31 is coplanar with the upper surface of the hard mask 28' in the sacrificial gate structures 25'.

FIG. 5 also depicts one embodiment of forming a blanket dielectric layer 46 atop the planarized upper surface of the interlevel dielectric layer 31 and the sacrificial gate cap 28', 28". The blanked dielectric layer 46 may be composed of a nitride, such as silicon nitride. The blanket dielectric layer 46 may be deposited using chemical vapor deposition, e.g., plasma enhanced chemical vapor deposition, atomic layer deposition, chemical solution deposition or spin on deposition.

Figure 6:
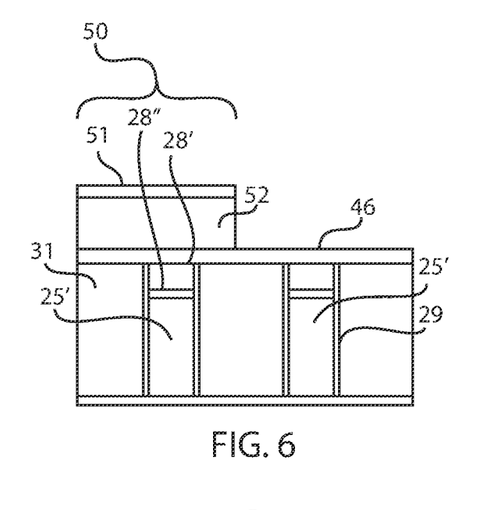
FIG. 6 is a side cross-sectional view (similar to the cross-section along section line X-X of FIG. 1) depicting one embodiment of forming an etch mask including a low temperature oxide (LTO) and an organic planarization layer (OPL) that exposes one of the gate structures depicted in FIG. 5.

FIG. 6 depicting one embodiment of forming an etch mask 50 including a low temperature oxide (LTO) 51 and an organic planarization layer (OPL) 52 that exposes one of the sacrificial gate structures 25' depicted in FIG. 5. The etch mask 50 that is depicted in FIG. 6 may be employed for the gate cut etch that determines the tip to tip (T2T) critical dimension (CD) that separates the gate structure present on the first active region from the gate structure that is present on the second active region. The gate cut etch formed the gate cut trench 10.

The organic planarization layer 52 can include a polyacrylate resin, epoxy resin, phenol resin, polyamide resin, polyimide resin, unsaturated polyester resin, polyphenylenether resin, polyphenylenesulfide resin, or benzocyclobutene (BCB). The organic planarization layer 52 can be deposited using chemical vapor deposition and/or spin on deposition. The low temperature oxide 51 is typically composed of silicon oxide ($SiO_2$), which can be formed using chemical vapor deposition (CVD).

The LTO layer 51 and the OPL 52 may be patterned and etched to provide an etch mask for gate cut etch that forms the gate cut trench 10. The LTO 51 and the OPL layer 52 may be patterned using photolithography and etch processes. Specifically, and in one example, an etch mask pattern is produced by applying a photoresist to the surface to be etched, exposing the photoresist to a pattern of radiation, and then developing the pattern into the photoresist utilizing a resist developer. Once the patterning of the photoresist is completed, the sections of the LTO layer 51 and the OPL layer 52 covered by the photoresist are protected, while the exposed regions are removed using a selective etching process. The term "selective" denotes that a first material may be etched at a faster rate to a second material. For example, the selective etch rate may remove a first material at a rate greater than 20:1, e.g., greater than 100:1, in comparison to a second material. The etch process may be reactive ion etch (RIE), which can be selective to blanket dielectric layer 46.

Figure 7:
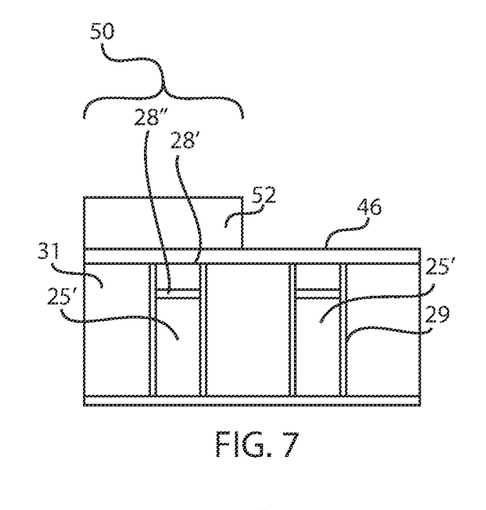
FIG. 7 is a side cross-sectional view (similar to the cross-section along section line X-X of FIG. 1) depicting one embodiment of removing the LTO layer from the structure depicted in FIG. 6.

FIG. 7 depicts one embodiment of removing the LTO layer 51 from the structure depicted in FIG. 6. The LTO layer 51 may be removed by an etch that is selective to the OPL layer 52. The etch process for removing the LTO layer 51 may also selective to the exposed portion of the blanket dielectric layer 45. The etch process for removing the LTO layer 51 may be an anisotropic etch or an isotropic etch. In some embodiments, the LTO layer 51 may be removed using reactive ion etch (ME) and/or a wet chemical etch. In some embodiments, the LTO layer 51 and OPL layer 52 may be omitted, as any patterning mechanism including those not requiring the LTO layer 21 and the OPL layer 52 may be used at this point of the process flow.

FIG. 8 depicts one embodiment of removing the exposed portion of the blanket dielectric layer 46, and selectively etching the replacement gate SiN hard mask 28' on top of 25' as seen in FIG. 7. The patterned replacement gate SiN hard mask 28' is the portion of the sacrificial gate structure 25' that will be etched to provide the gate cut, i.e., the gate cut trench 5 that provides the tip to tip (T2T) dimension separating adjacent gate structures. The etch process for recessing the sacrificial gate hard mask 28' may also recess the exposed gate sidewall spacers 29. The etch process for removing the exposed portion of the blanket dielectric layer 46, selectively etching the sacrificial gate hard mask 28', and recessing the exposed gate sidewall spacers 29 may be an anisotropic etch, such as reactive ion etch (ME), gas plasma etching or laser milling/laser etching. This dry etching technique is desired to maintain gate cut tip-to-tip critical dimensions without lateral undercut of SiN beneath the OPL layer 52. In other embodiments, the etch process for removing the exposed portion of the blanket dielectric layer 46, selectively etching the sacrificial gate hard mask 28', and recessing the exposed gate sidewall spacers 29 may be an isotropic etch, such as a wet chemical etch. In some embodiments, the etch process for removing the exposed portion of the blanket dielectric layer 46, selectively etching the sacrificial gate hard mask, and recessing the exposed gate sidewall spacers 29 may be a combination of anisotropic etching, e.g., reactive ion etching (RIE) and isotropic etching, e.g., wet chemical etching.

Figure 9:
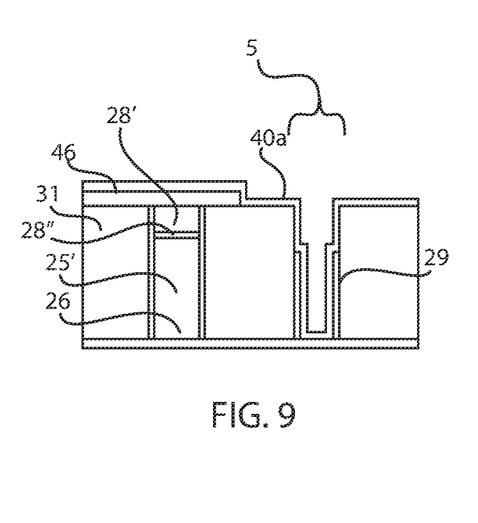
FIG. 9 is a side cross-sectional view (similar to the cross-section along section line X-X of FIG. 1) depicting one embodiment of removing a sacrificial gate electrode portion of the sacrificial gate structure in a gate cut process flow to define the tip to tip dimension separating adjacent gate structures on adjacent active field regions of an electrical device, and forming a etch stop layer in the gate cut trench.

In some embodiments, the remaining portion of the organic planarization layer (OPL) 52 may then be removed using a selective etch. FIG. 9 depicts one embodiment of selectively etching the remaining sacrificial gate electrode portion of the sacrificial gate structure 25' in a gate cut process flow to define the tip to tip dimension separating adjacent gate structures on adjacent active field regions of an electrical device. The etch process for removing the exposed sacrificial gate structure 25' may be selective to the remaining portion of the gate sidewall spacers 29 and sacrificial SiN liner 46 that are exposed by the mask composed of the patterned organic planarization layer 52. Removing the remaining portion of the sacrificial gate structure 25' produces the gate cut trench 5.

FIG. 9 depicts the selective etching of the sacrificial gate structure 25' to form the gate cut and the subsequent selective etch stop layer 40a within the gate cut trench 5. The sacrificial gate structure 25' is removed by an anisotropic etching process to maintain required gate tip-to-tip dimensions. In one embodiment, the sacrificial gate structure 25' is removed by reactive ion etch (ME).

FIG. 9 further depicts one embodiment of forming a first conformal dielectric layer 40a, i.e., first etch stop layer 40a, within the gate trench opening 5. The first conformal dielectric layer 40a is deposited using a conformal deposition process on the sidewalls and base of the gate trench opening 5. The first conformal dielectric layer 40a is formed on the gate sidewall spacers 29 that are present within the gate trench opening 5. The first etch stop layer 40a may be deposited using a conformal deposition technique to fill high aspect ratio trenches, such as Atomic Layer Deposition (ALD). In some embodiments, chemical vapor deposition (CVD) may be suitable method for etch-stop layer deposition. The composition of the first conformal dielectric layer 40a may be composed of hafnium oxide ($HfO_2$). The composition of the first conformal dielectric layer 40a is selected to function as an etch stop layer that obstructs the sidewalls of the gate cut trench 5 from being laterally etched by etch processes for forming a power rail 10 within the gate cut trench 5. The composition of the first conformal dielectric layer 40a also functions as an etch stop to control over etch so that the substrate 1 that is underlying the gate cut trench 5 is not etched by the etch process for forming the power rail 10.

Figure 10:
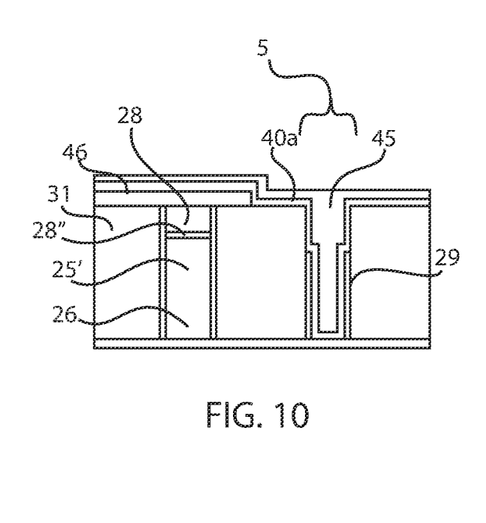
FIG. 10 is a side cross-sectional view (similar to the cross-section along section line X-X of FIG. 1) depicting forming a nitride containing fill for the gate cut trench on the conformal etch stop layer.

FIG. 10 depicts forming a nitride containing fill 45 within the gate cut trench 10 on the first conformal dielectric layer 40a, i.e., first conformal etch stop layer 40a. In some embodiments, the nitride containing fill 45 may be composed of silicon nitride. The nitride containing fill 45 should be deposited using a conformal deposition process to fill high aspect ratio trenches, or a bottom-up deposition technique to ensure that there are no voids formed by dielectric pinch-off at the top of the trench opening. In some embodiments, the nitride fill 45 is deposited using atomic layer deposition (ALD) process for conformal sidewall coverage which prevents pinch-off. In some embodiments, a cyclic deposition and etch-back deposition sequence process may be used to perform a bottom-up nitride fill within the gate cut trench. This film may be deposited using a chemical vapor deposition (CVD) process that may include Atmospheric Pressure CVD (APCVD), Low Pressure CVD (LPCVD), Plasma Enhanced CVD (PECVD), Metal-Organic CVD (MOCVD) and combinations thereof. In some embodiments, the nitride containing fill 45 may be deposited to fill the entirety of the gate cut trench 5. In some embodiments, a portion of the nitride containing fill 45 may overfill the gate cut trench 5 extending onto the upper surface of the interlevel dielectric 31 and the remaining portion of the blanket deposited nitride layer 46.

Figure 11:
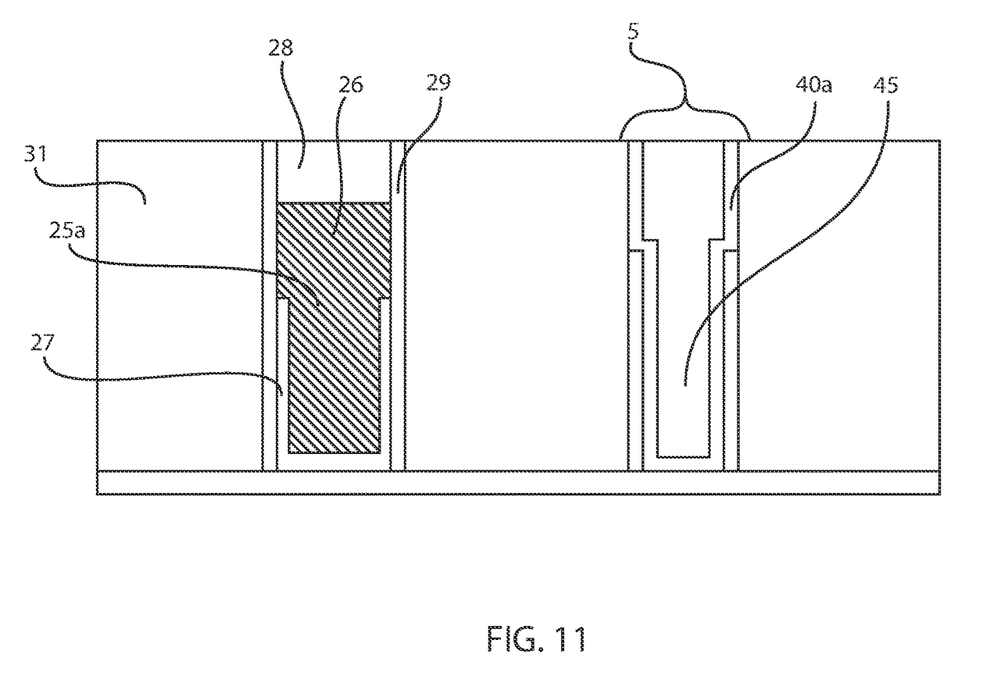
FIG. 11 is a side cross-sectional view (similar to the cross-section along section line X-X of FIG. 1) depicting the active gate after replacement gate removal and high-k/metal replacement gate deposition (left) and the cut gate trench filled with the etch stop layer and SiN liner (right). This structure also contains W metal gate recess and self-aligned contact (SAC) SiN Cap deposition and resembles the structure in FIG. 4C (Y-Y direction) prior to power rail patterning.

FIG. 11 is a side cross-sectional view having the orientation along section line X-X (as illustrated in FIG. 1) depicting the final structure of the active gate and cut gate prior to middle of line (MOL) contact patterning and etching of the power rail interconnect. The structure in FIG. 10 is planarized using chemical mechanical planarization (CMP), which removes the portion of the nitride containing fill 45 that extends outside the gate cut trench 5. The planarization process may also remove a remaining portion of the blanket nitride layer 46 to expose the gate hard mask 28' cap above the sacrificial replacement gate structure 25'. The gate hard mask 28' is then selectively removed using an anisotropic reactive ion plasma etch (RIE) that preserves the interlevel dielectric 31 height. After the gate hard mask etching the replacement gate in the active regions 25a, 25b is selectively removed using an isotropic etching process which is selective to both interlevel dielectric 31, sidewall spacers 29 and dielectric gate cut fill liners 45, 40a and 40b. This selective removal of the replacement Silicon uses a wet chemistry which can be ammonium hydroxide ($NH_4OH$) or Tetraethylammonium Hydroxide (TEAH). Selective dry etching based techniques can also be used to etch the dummy gate Silicon to expose the active fin channels within the gate structures.

A functional gate structure 25a is formed in the space that is provided by removing the sacrificial gate structure 25'. After the dummy gate silicon is selectively removed from the PC in the active areas to expose the fin channels, the dummy gate oxide on the fins is removed using a dry or wet etch. The fin surface is then pre-cleaned using a dilute HF (DHF) etch and high-k oxide is deposited on the fins to serve as the gate dielectric.

In some embodiments, the functional gate structure 25a is formed in direct contact with a channel region portion of the fin structures in the active region of the device. The functional gate structure 25a typically includes at least one gate dielectric layer 27 and at least one gate conductor layer 26. The at least one gate dielectric layer 27 is typically positioned directly on at least the channel portion of the fin structures in the active regions of the substrate 1. The at least one gate dielectric layer 27 may be formed by a thermal growth process, such as, e.g., oxidation, nitridation or oxynitridation. The at least one gate dielectric layer 27 may also be formed by a deposition process, such as, e.g., CVD, plasma-assisted CVD, MOCVD, ALD, evaporation, reactive sputtering, chemical solution deposition and other like deposition processes. The at least one gate dielectric layer 27 may also be formed utilizing any combination of the above processes.

The at least one gate dielectric layer 27 may be comprised of an insulating material having a dielectric constant of about 4.0 or greater. In another embodiment, the at least one gate dielectric layer 27 is comprised of an insulating material having a dielectric constant greater than 7.0. The dielectric constants mentioned herein are relative to a vacuum. In one embodiment, the at least one gate dielectric layer 27 employed in the present description includes, but is not limited to, an oxide, nitride, oxynitride and/or silicates including metal silicates, aluminates, titanates and nitrides. In one example, when the at least one gate dielectric layer 27 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 27 may vary, but typically, the at least one gate dielectric layer 27 has a thickness from 1 nm to 10 nm. In another embodiment, the at least one gate dielectric layer has a thickness from 1 nm to 3 nm.

After forming the material layer for the at least one gate dielectric layer 27, a layer of a conductive material which forms the at least one gate conductor 26 of functional gate structure 25a is formed on the at least one gate dielectric 27 utilizing a deposition process, such as physical vapor deposition (PVD), CVD or evaporation.

In some embodiments, the conductive film may be composed of a work function metal (WFM) to set the required threshold voltage for both NFET and PFET. This WFM may be different between NFET and PFET and composed of several stacked layers of conductive liners. The conductive material may comprise polysilicon, SiGe, a silicide, a metal or a metal-silicon-nitride such as Ta—Si—N. Examples of metals that can be used as the conductive material include, but are not limited to, Al, W, Cu, and Ti, TiN, TiC or other like conductive metals. The layer of conductive material may be doped or undoped. If doped, an in-situ doping deposition process may be employed. Alternatively, a doped conductive material can be formed by deposition, ion implantation and annealing.

The bulk gate metal, e.g. W, is then planarized using a chemical mechanical planarization (CMP) process and subsequently recessed below the top of the spacers 29 and interlevel dielectric 31 using a selective dry etch process. A self-aligned contact cap layer (such as SiN) is deposited in the recessed cavity and is then planarized to form the middle of line SAC Cap layer on active gates. This is the final active gate structure shown in FIG. 11 (left) and the neighboring cut gate trench is filled with SiN and the selective stop layers.

Forming the power rail 10 may begin with forming a power rail opening in the gate cut trench 5. The power rail opening may be formed into the nitride containing fill 45. The power rail openings may be formed using photolithography and etch processes. Specifically, and in one example, a etch mask pattern is produced by depositing a patterning stack and applying a photoresist to the surface to be etched, exposing the photoresist to a pattern of radiation, and then developing the pattern into the photoresist utilizing a resist developer. Once the patterning of the photoresist is completed, the sections of the structure covered by the photoresist are protected, while the exposed regions are removed using a selective etching process that removes the unprotected regions to form power rail openings in the gate cut trench 5. The etch process for forming the power rail openings may include reactive ion etch (RIE), which is selective to the first conformal dielectric layer 40a, which provides a first conformal etch stop layer 40a. The etch stop obstructs lateral etching that would increase the tip to tip dimension of the gate cut trench 5, as well as obstructing vertical etching that could cut through the base of the gate cut trench 5 into the underlying substrate 1

In one example, the first step of the CB power rail etch includes a $SiO_2$ etch component to etch down through an oxide patterning layer, which is initially deposited on top of the self-aligned contact SiN Cap. In prior methods, this process etches through the "etch stop" portion on the sidewalls of the cut PC region and form a trench within the CT region, i.e., gate cut trench 5, as depicted in FIGS. 3A and 3B. In some embodiments of the methods and structures described herein, as depicted in FIGS. 4A-4C, the second step to the CB power rail etch is a SiN etch of the self-aligned cap (SAC), also referred to as gate dielectric cap 28, to expose the gate structure, i.e., gate conductor portion of the gate structure. In this example, the etch process, e.g., reactive ion etch (ME) for forming the opening to the gate structure for the gate contact, i.e., CB gate contact, and the opening within the gate cut trench 5 for the power rail 10, i.e., CB power rail, can be the same etch process, i.e, in the same step.

The conformal dielectric layer 40a, which can be composed of $HfO_2$, can overcome this problem, wherein the conformal dielectric layer 40a regions of the gate cut trench 5 fill, i.e., CT fill, obstruct shorting of the active gate (CD blow-up/overlay problems) or shorting through the substrate by etching downward (potentially through a seam/void in the SiN CT liner fill). The bottom etch stop layer 40a prevents this etch into the substrate 1 and the sidewall (on the gate tip-to-tip sections) prevents lateral CB power rail etch into the gate 25.

Following formation of the power rail openings, the power rail openings may be filled with an electrically conductive material to provide the power rail 10. The electrically conductive material of the power rail 10 may be a metal, such as aluminum, copper, tungsten, titanium, tantalum, platinum, gold, silver or a combination thereof. In some embodiments, the electrically conductive material of the power rail 10 may be deposited using physical vapor deposition (PVD), chemical vapor deposition (CVD) or atomic layer deposition (ALD) methods. In one example, in which the metal layer of nickel (Ni) and platinum (Pt) is deposited by physical vapor deposition (PVD) method, the deposition process may include sputtering. Examples of sputtering apparatus that may be suitable for depositing the electrically conductive material for the power rail 10 include DC diode type systems, radio frequency (RF) sputtering, magnetron sputtering, and ionized metal plasma (IMP) sputtering. In another example, the metal layer including nickel (Ni) and platinum (Pt) within the via opening 15 using plating processes, such as electroplating or electroless plating. In the embodiments, in which electrically conducive material may be deposited into the power rail openings using chemical vapor deposition (CVD), in which the chemical vapor deposition (CVD) process may be selected from the group consisting of Atmospheric Pressure CVD (APCVD), Low Pressure CVD (LPCVD) and Plasma Enhanced CVD (PECVD), Metal-Organic CVD (MOCVD) and combinations thereof may also be employed. It is noted that the aforementioned examples of deposition processes are provided for illustrative purposes only, and are not intended to limit the methods and structures described herein, as other deposition processes may be equally applicable, so long as enough material may be deposited within the power rail openings to provide the power rail 10.

FIGS. 5-11 depict one embodiment of a method of forming a power rail 10 in a gate cut trench 5 including only one conformal etch stop layer, i.e., a first conformal dielectric layer 40a, that obstructs lateral etching and over-etching during the process sequence for forming the power rail, as depicted in FIGS. 4A and 4C.

Figure 12:
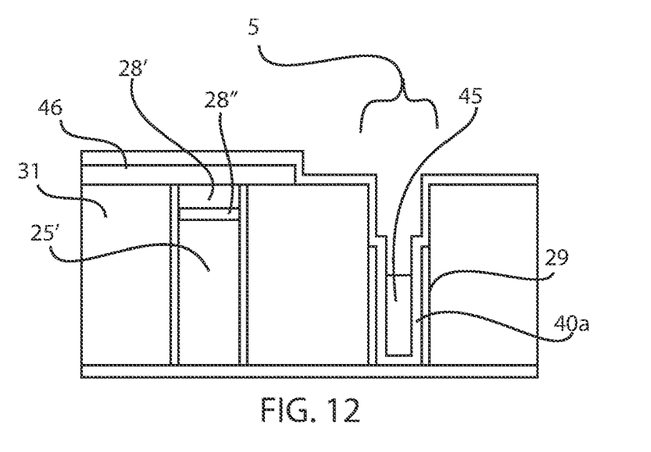
FIG. 12 is a side cross-sectional view (similar to the cross-section along section line X-X of FIG. 1) depicting another embodiment of a process flow that includes two etch stop layers within a gate cut trench, in which the method includes recessing the nitride containing fill depicted in FIG. 10.

FIGS. 12-15 depict another embodiment, in which the method for forming the power rail 10 in a gate cut trench 5 including only two conformal etch stop layers, a first conformal dielectric layer 40a and a second conformal dielectric layer 40b, as depicted in FIGS. 4A and 4B. Referring to FIG. 12, in one embodiment of the method that includes two etch stop layers, e.g., first conformal dielectric layer 40a and a second conformal dielectric layer 40b, may begin with recessing the nitride containing fill 45 that is depicted in FIG. 10. The nitride containing fill 45, which for this embodiment may be referred to as a first nitride containing fill 45, may be recessed using an etch process, such as reactive ion etch (RIE). The depth at which the first nitride containing fill 45 is recessed to is typically selected to dictate the depth of the lower surface of the power rail 10.

Figure 13:
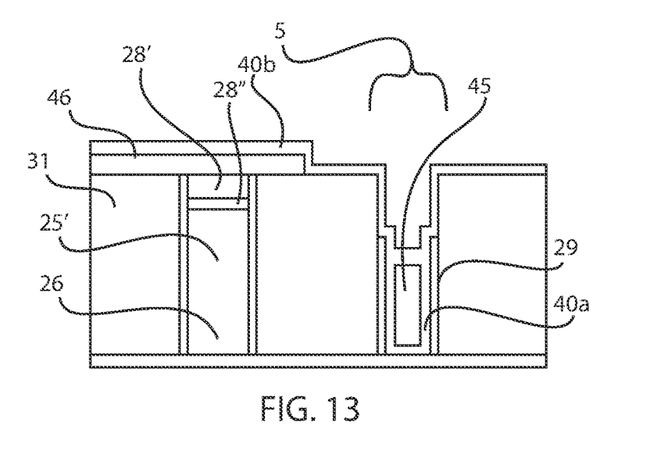
FIG. 13 is a side cross-sectional view (similar to the cross-section along section line X-X of FIG. 1) depicting one embodiment of forming a second conformal etch stop layer on the recessed surface of the nitride containing fill that is depicted in FIG. 12.

FIG. 13 depicts one embodiment of forming a second conformal etch stop layer 40b, i.e., second conformal dielectric layer 40b, on the recessed surface of the first nitride containing fill 45 that is depicted in FIG. 12. The second conformal etch stop layer 40b may be deposited on the sidewalls of the gate cut trench 5 that are above the recessed surface of the first nitride containing fill 45. The second conformal etch stop layer 40b is similar to the first conformal etch stop layer 40a that has been described above with reference to FIG. 9. Therefore, the above description of the first conformal etch stop layer 40a is suitable for describing one embodiment of forming the second conformal etch stop layer 40b. For example, the second conformal etch stop layer 40b may be composed of hafnium oxide that is formed using chemical vapor deposition.

Figure 14:
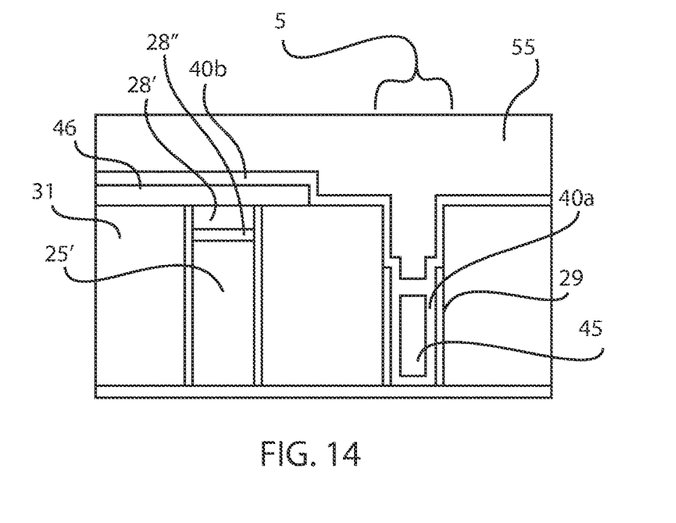
FIG. 14 is a side cross-sectional view (similar to the cross-section along section line X-X of FIG. 1) depicting one embodiment of forming a second fill material atop the second conformal etch stop layer that is depicted in FIG. 13.

FIG. 14 depicts one embodiment of forming a second fill material 55, e.g., second nitride containing fill material 55, atop the second conformal etch stop layer 40b that is depicted in FIG. 13. The second nitride containing fill material 55 may be deposited to fill the space above the recessed surface of the first nitride containing fill 45. The second nitride containing fill material 55 is similar to the first nitride containing fill material 45 that has been described above with reference to FIG. 10. Therefore, the above description of the first nitride containing fill material 45 is suitable for describing one embodiment of forming the second nitride containing fill material 55. For example, the second nitride containing fill material 55 may be composed of silicon nitride that is formed using chemical vapor deposition.

Figure 15:
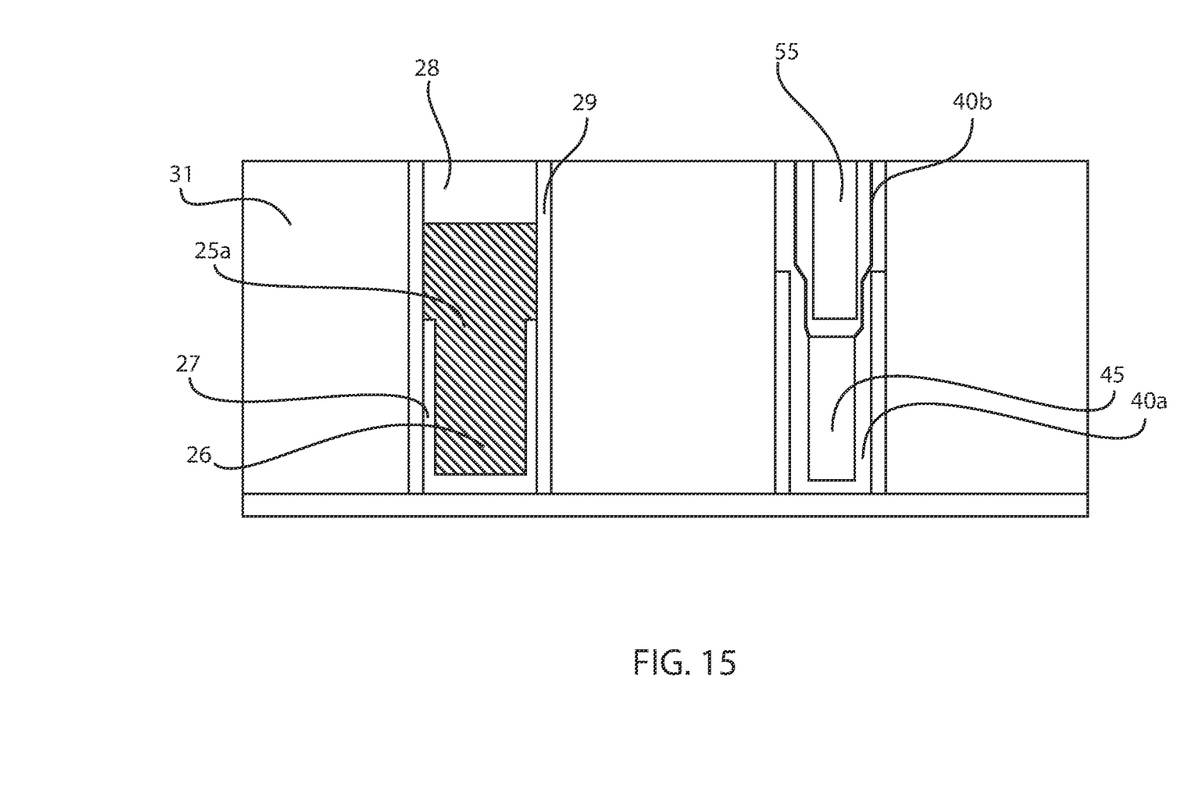
FIG. 15 is a side cross-sectional view (similar to the cross-section along section line X-X of FIG. 1) of the active gate after replacement gate removal and high-k/metal replacement gate deposition (left) and the cut gate trench filled with the etch stop layer and SiN liner (right). This structure also contains W metal gate recess and self-aligned contact (SAC) SiN Cap deposition and resembles the structure in FIG. 4B (Y-Y direction) prior to power rail patterning.

FIG. 15 depicts planarizing the structure depicted in FIG. 14 so that the upper surface of the second nitride containing fill material 55 is coplanar with the upper surface of the interlevel dielectric 31 and the upper surface of the sacrificial gate hard mask 28' that is not etched to provide the gate cut trench. The planarization process may be provided by chemical mechanical planarization.

FIG. 15 is a side cross-sectional view having the orientation along section line X-X (as illustrated in FIG. 1) depicting the final structure of the active gate and cut gate prior to middle of line (MOL) contact patterning and etching of the power rail interconnect. The cut gate in this second embodiment is similar to FIG. 11 but contains the additional etch stop layer as described in FIGS. 12-14.

This second embodiment contains similar processing steps as described above the above sections, including dummy gate silicon removal, replacement metal gate formation and self-aligned cap formation. The CB power rail is also processed in the same details as described in the above sections to form the local interconnect within the gate cut trench.

In some embodiments, the recess depth in FIG. 15 would be where the CB power rail resides, but across PC there would be a continuous CB power rail line not obstructed by the etch stop layer on the cut PC sidewalls (this is etched during the $SiO_2$ etch and over-etch of the first component).

Having described preferred embodiments of a structure and method for forming GATE CUT WITH INTEGRATED ETCH STOP LAYER, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
   providing a substrate;
   providing a sacrificial gate structure above the substrate, the sacrificial gate structure having a sacrificial gate cap on a top surface of the sacrificial gate structure,
      wherein the sacrificial gate structure comprises sacrificial gate structure materials, and
      wherein the sacrificial gate cap comprises sacrificial gate cap materials;
   etching through the sacrificial gate cap and the sacrificial gate structure to form a gate cut trench and separate first and second sacrificial gate segments, each sacrificial gate segment comprising sacrificial gate structure materials and sacrificial gate cap materials;
   depositing a first etch stop layer on the exposed surfaces of the gate cut trench;
   filling the gate cut trench by depositing a first dielectric material to form a first dielectric fill region;
   etching an upper portion of the first dielectric fill region to form a first recess;
   depositing a second etch stop layer on a bottom surface and the sidewalls of the first recess; and
   depositing a second dielectric material on the second etch stop layer to fill the first recess.

2. The method of claim 1, further comprising:
   etching the second dielectric material to form a second recess;
   depositing an electrically conductive material in the second recess; and
   planarizing the electrically conductive material.

3. The method of claim 1, wherein the first etch stop layer comprises an oxide.

4. The method of claim 1, wherein the first etch stop layer comprises hafnium oxide.

5. The method of claim 1, wherein the second etch stop layer comprises an oxide.

6. The method of claim 1, wherein the second etch stop layer comprises a rare earth oxide.

7. The method of claim 1, wherein the second etch stop layer comprises hafnium oxide.

8. The method of claim 1, wherein the second etch stop layer has a thickness of about 1 nm.

9. The method of claim 1, wherein the second etch stop layer has a thickness of about 2 nm.

10. The method of claim 1, wherein the second etch stop layer has a thickness of about 5 nm to about 25 nm.

11. The method of claim 2, wherein the electrically conductive material comprises Tungsten.

12. The method of claim 2, wherein the electrically conductive material comprises Cobalt.

13. The method of claim 2, wherein the electrically conductive material comprises Ruthenium.

14. The method of claim 2, wherein the electrically conductive material comprises Titanium, Aluminum, or Copper.

15. A method of forming a semiconductor device, comprising:
   providing a substrate;
   providing a sacrificial gate structure above the substrate;
   etching through the sacrificial gate structure to form a gate cut trench and separate first and second sacrificial gate segments;
   depositing a first etch stop layer on the exposed surfaces of the gate cut trench;
   filling the gate cut trench by depositing a first dielectric material to form a first dielectric fill region;
   planarizing the first dielectric material;
   etching an upper portion of the first dielectric fill region to form a first recess;
   depositing a second etch stop layer on a bottom surface and the sidewalls of the first recess;
   depositing a second dielectric material on the second etch stop layer to fill the first recess; and
   planarizing the second dielectric material.

16. The method of claim 15, further comprising:
   etching the second dielectric material to form a second recess;
   depositing an electrically conductive material in the second recess; and
   planarizing the electrically conductive material.

17. The method of claim 15, wherein the second etch stop layer comprises an oxide.

18. The method of claim 15, wherein the second etch stop layer comprises a rare earth oxide.

19. The method of claim 15, wherein the second etch stop layer comprises hafnium oxide.

20. The method of claim 15, wherein the second etch stop layer has a thickness of about 1 nm.

21. The method of claim 15, wherein the second etch stop layer has a thickness of about 2 nm.

22. The method of claim 15, wherein the second etch stop layer has a thickness of about 5 nm to about 25 nm.

23. The method of claim 16, wherein the electrically conductive material comprises Cobalt.

24. The method of claim 16, wherein the electrically conductive material comprises Ruthenium.

25. The method of claim 16, wherein the electrically conductive material comprises Titanium, Aluminum, or Copper.

* * * * *